(12) United States Patent
Zhang

(10) Patent No.: US 6,255,861 B1
(45) Date of Patent: Jul. 3, 2001

(54) HYBRID LOW VOLTAGE SWING SENSE AMPLIFIER

(75) Inventor: Kevin X. Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/351,140

(22) Filed: Jul. 12, 1999

(51) Int. Cl.$^7$ ................................................. G01R 19/00
(52) U.S. Cl. ............................ 327/51; 327/55; 327/56
(58) Field of Search .......................... 326/95, 112, 115; 327/51, 52, 53, 54, 55, 56, 57, 200, 210, 211

(56) References Cited

U.S. PATENT DOCUMENTS

| | | | |
|---|---|---|---|
| 4,561,702 | * 12/1985 | McAdams | 365/230 |
| 5,144,168 | * 9/1992 | Tran | 326/87 |
| 5,729,159 | * 3/1998 | Gersbach | 327/52 |
| 5,796,273 | * 8/1998 | Jung et al. | 327/55 |

OTHER PUBLICATIONS

Samurai et al, "Low–Power CMS Design through $V_{th}$ Control and Low–Swing Circuits", 1997 International Symposium on Low Power Electronics and Design, Aug. 18–20, 1997, Monterey, California; Association for Computing Machinery, New York, New York.

* cited by examiner

Primary Examiner—Kenneth B. Wells
Assistant Examiner—Paul Dinh
(74) Attorney, Agent, or Firm—Kenyon & Kenyon

(57) ABSTRACT

A sense amplifier may include a pair of output terminals, an evaluation circuit, a reference circuit and a pair of clamping circuits. The evaluation circuit connects a first output terminal to an evaluation potential. It receives a data signal at an input terminal. The reference circuit connects a second output terminal to the evaluation potential. The reference circuit receives a pair of reference signals on other input terminals. The clamping circuits each couple a respective one of the output terminals to a precharge potential. Inputs of each clamping circuit are coupled to the other of the output terminals.

27 Claims, 1 Drawing Sheet

100

400

HYBRID LOW VOLTAGE SWING SENSE AMPLIFIER

BACKGROUND

The present invention relates to an improved low voltage swing logic circuit for use in an integrated circuit.

Low voltage swing ("LVS") circuits are known per se. Systems built upon such circuits typically carry data on a pair of wires. During a precharge phase, both the wires are precharged to a predetermined potential. During an evaluation phase, a first wire carries a true value of the data signal and a second wire carries the complement value of the data signal. The LVS circuit generates an output response to voltage differences between the true and complementary signals.

LVS circuits are advantageous because they achieve higher data throughput than conventional "full swing" logic circuit. In a "full swing" circuit, a data signal typically transitions completely to either ground or $V_{CC}$ before the circuit can generate an output signal. Because an LVS circuit can sense data from small voltage differences, LVS circuits realize faster operation and improved throughput than conventional full swing logic circuits. Further, because full swing transitions are not necessary to detect useful data, the voltages used within an LVS integrated circuit are reduced over a corresponding full swing circuit, thereby contributing to reduced power consumption.

Because each data signal is carried through the LVS circuit on a pair of wires, LVS circuits include twice as many metal tracks or wires between circuit elements than are in a corresponding full swing circuit. Although the metal pitch may be made tighter in an LVS circuit because of the reduced voltages, the doubling of wires in an LVS integrated circuit can lead to wiring congestion in the circuit. Such disadvantages can limit the applications for which circuit designers may choose to use LVS circuits.

Accordingly, there is a need in the art for an integrated circuit that possesses the speed and throughput advantages of LVS circuits but that also do not suffer the corresponding disadvantages of wiring congestion.

SUMMARY

Embodiments of the present invention provide a hybrid LVS sense amplifier. The sense amplifier includes a pair of output terminals, an evaluation circuit, a reference circuit and a pair of clamping circuits. The evaluation circuit connects a first output terminal to an evaluation potential. It receives a data signal at an input terminal. The reference circuit connects a second output terminal to the evaluation potential. The reference circuit receives a pair of reference signals on other input terminals. The clamping circuits each couple a respective one of the output terminals to a precharge potential. Inputs of each clamping circuit are coupled to the other of the output terminals.

DETAILED DESCRIPTION

According to an embodiment, the present invention provides a hybrid LVS sense amplifier that generates valid full rail output signals in response to only a single value of a data signal, the true value. The present invention omits the requirement that a complement value of the data signal be carried throughout the LVS system.

Figure 1:
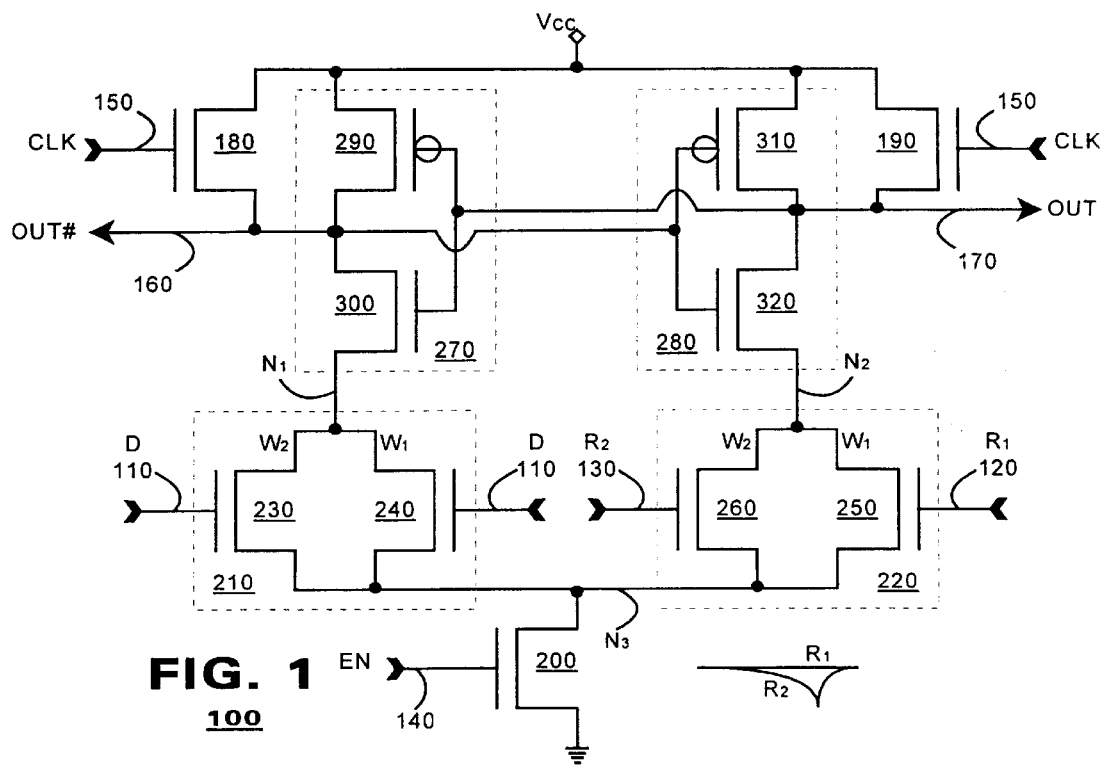
FIG. 1 illustrates a data bus according to an embodiment of the present invention.

FIG. 1 illustrates a sense amplifier 100 constructed according to an embodiment of the present invention. The sense amplifier 100 may be populated by a plurality of input terminals 110–130 for input of a data signal D and a pair of reference signals $R_1$ and $R_2$ respectively. The sense amplifier 100 also may include additional input terminals 140, 150 for the application of respective enabling and clocking signals. Further, the sense amplifier 100 may include output terminals 160–170 for the output of differential output signals OUT# and OUT.

The embodiment of the sense amplifier 100 may include a pair of precharge transistors 180–190, each of which couples a respective output terminal 160, 170 to a precharge potential. In the exemplary embodiment illustrated in FIG. 1, the precharge transistors 180–190 are shown coupled to $V_{CC}$. Gates of the precharge transistors 180–190 are coupled to the input terminal 150 for the clock signal. The sense amplifier 100 may include an enabling transistor 200 coupled to an evaluation potential, shown as ground in the example of FIG. 1.

The sense amplifier 100 may be populated by an evaluation circuit 210 and a reference circuit 220. The evaluation circuit 210 bridges an intermediate node N1 in the sense amplifier 100 to ground via the enabling transistor 200. The evaluation circuit 210 may include a pair of data transistors 230, 240 providing parallel paths from node N1 to the enabling transistor 200. Gates of each data transistor 230, 240 of the evaluation circuit 210 may be coupled to the input terminal 110 for the data signal D.

A reference circuit 220 may couple a second intermediate node N2 to the enabling transistor 220. The reference circuit 220 also may include a pair of transistors 250, 260 providing paths from node N1 to the enabling transistor 200. A gate of a first transistor of the reference circuit 220 may be coupled to an input terminal 120 corresponding to the R1 signal. A gate of a second transistor of the reference circuit 220 may be coupled to an input terminal 130 of the R2 signal.

The sense amplifier 100 also may be provided with a pair of clamping circuits 270, 280, one provided in association with each of the output terminals 160, 170. A first clamping circuit 270 may include a pair of transistors 290, 300 each coupled to the output terminal 160 for the OUT# signal. A first transistor 290 bridges the output terminal 160 to the precharge potential (e.g. $V_{CC}$). A second transistor 300 couples the output terminal 160 to the evaluation circuit 210. Gates of the first and second transistors 290, 300 are connected to the output terminal 170 associated with the OUT signal.

The second clamping circuit 280 also may include a pair of transistors 310, 320 each coupled to the output terminal 170 associated with the OUT signal. The first transistor 310 bridges the output terminal 170 to a precharge potential. The second transistor 320 couples the output terminal 170 to the reference circuit 220. Gates of the first and second transistors 310, 320 are connected to the output terminal 160 associated with the OUT# signal.

Embodiments of the sense amplifier 100 may find application in a domino system in which signals such as data signal D transition through a precharge phase and an evaluation phase on each clock cycle. During a precharge phase, each signal is maintained at a precharge potential (such as $V_{CC}$). The signals do not carry any information content during the precharge phase. During an evaluation phase, depending upon its information content, a signal may transition from the precharge potential toward the evaluation potential. In an LVS circuit employing domino techniques, the signal typically would make a partial transition toward the evaluation potential, not a complete transition as would occur in full swing circuits.

The embodiment of FIG. 1 as illustrated is a "precharge high, evaluate low" circuit; the precharge potential is at $V_{CC}$ and the evaluation potential is ground. The data transistors 230–240, the reference transistors 250–260 the clamping transistors 300,320 and the precharge transistors 180–190 may be selected to be of a type that is conductive in response to the precharge potential. For example, in the "precharge high" embodiment of FIG. 1, the transistors 180–190, 230–260, 300 and 320 may be NMOS transistors. Additionally, the clamping transistors 290, 310 may be selected to be of a type that is conductive in response to the evaluation potential. For example, in the "evaluate low" embodiment of FIG. 1 the transistors 290, 310 may be PMOS transistors.

According to an embodiment of the present invention, the reference signals may be "dummy" domino signals. Although they precharge in a manner that is consistent with true domino signals, their behavior during the evaluation phase is predetermined. The first reference signal $R_1$, does not evaluate; it remains at the precharge potential during both the precharge phase and the evaluation phase. The second reference signal $R_2$ always evaluates; it transitions toward the evaluation potential during the evaluation phase.

Consider operation of the sense amplifier 100 in the context of these dummy domino signals. During the precharge phase, the enable signal is low rendering the enable transistor 200 nonconductive. The clock signal is high, rendering the clocking transistors 180, 190 conductive. Further, the data signal D and the two reference signals $R_1$, $R_2$ are precharged high, rendering transistors 230–260 conductive. Because the output terminals 160, 170 are precharged, the second transistors 300, 320 of the two clamping circuits 270, 280 are conductive. Thus, intermediate nodes $N_1$ and $N_2$ are precharged under the influce of $V_{CC}$. Further, because the data transistors 230–260 all are conductive, node $N_3$, the source of the enable transistor 200, also is precharged.

During the evaluation phase, the enable transistor 200 becomes conductive and node $N_3$ discharges to ground. In the reference circuit 220, the R2 signal begins to transition toward the evaluation potential, rendering reference transistor 260 increasingly less conductive. However, the $R_1$ signal remains at the precharge potential and the reference transistor 250 remains strongly conductive node $N_2$ begins to discharge through transistor 250.

In evaluation circuit 210, the data signal D may or may not evaluate depending upon the information content of the signal. If the data signal D does not evaluate, it remains at the precharge potential. Both data transistors 230, 240 remain strongly conductive. In this event, node $N_1$ discharges to ground through both transistors. Node $N_1$ discharges quickly through the two transistors 230–240 as compared to node $N_2$. If the data signal D does evaluate, both data transistors 230, 240 become increasingly non-conductive. The node $N_1$ discharges slowly relative to node $N_2$.

As shown above, during the evaluation phase, the two data transistors 230, 240 of the evaluation circuit 210 operate in unison; they either remain conductive or become nonconductive. By contrast, the data transistors 250, 260 of the reference circuit 220 never operate in unison; one transistor 250 always remains conductive and the other transistor 260 always becomes non-conductive during the evaluation phase. According to an embodiment of the present invention, this difference in operation achieves timing differences in the discharge rates of the nodes $N_1$, $N_2$. If the data signal evaluates, node $N_2$ discharges faster than node $N_1$; if not, node $N_2$ discharges more slowly than node $N_1$.

At the beginning of the evaluation phase, the two NMOS transistors 300, 320 of the clamping circuits 270, 280 are conductive. Thus, the output terminals 160, 170 discharge at the same rate as nodes $N_1$ and $N_2$ respectively. As an output terminal (say, OUT# terminal 160) discharges, the second transistor 310 of the second clamping circuit 280 associated with the second output terminal 170 becomes increasingly less conductive, slowing the rate of discharge of the second output terminal 170. Further, the first transistor 310 of the second clamping circuit 280 becomes conductive which causes the output terminal 170 to charge to the precharge potential. Thus, as a first output terminal discharge 160, it tends to causes the second output terminal 170 to be charged.

Eventually, during the evaluation phase, the discharging effect of one of the nodes $N_1$, $N_2$ becomes dominant. One of the output terminals 160 evaluates and the other terminal 170 is prevented from evaluating by their respective clamping circuits 270, 280.

As is known, transistors for use in integrated circuits may be "weighted." That is, a first transistor may possess a different weight than a second transistor. Differences in weights cause different transistors to behave differently in terms of the rate at which they cause terminals to charge or discharge. However, it is difficult to manufacture integrated circuits having precise weights in individual transistors.

According to an embodiment of the invention, the data transistors 230–260 may be weighted devices. A first transistor 230, 250 in the evaluation circuit 210 and the reference circuit 220 has a first weight (labeled $W_1$) and a second transistor 240, 260 of the evaluation circuit 210 and the reference circuit 220 has a second weight (labeled $W_2$). The weight ratio of $W_1$ to $W_2$ affects the rates at which nodes $N_1$ and $N_2$ may discharge. According to an embodiment, weight $W_2$ is selected to provide a relatively slower discharge path than $W_1$. In such an embodiment, if the data signal D were to evaluate, node $N_1$ would discharge primarily through transistor 240 (a $W_1$ transistor) while node $N_2$ would discharge through transistor 260 (a slower $W_2$ transistor). Node $N_1$ would quickly become a dominant node in this event. Alternatively, if the data signal D does not evaluate, node $N_1$ would not discharge at all and node $N_2$ would discharge through transistor 260. Node $N_2$ would become the dominant discharging node.

Although an embodiment of the sense amplifier 100 may include weighted transistors that, ordinarily, are difficult to manufacture the architecture of the sense amplifier 100 provides an advantage that is not realized in other designs. The typical difficulties of manufacture are ameliorated because the evaluation circuit zip and the reference circuit 220 possess a mutually symmetrical architecture. When the design of the present invention manufactured, it will be important to control the weight ratios of the various weighted transistors 230–260 rather than the magnitudes of the weights themselves. Accordingly, the sense amplifier 100 provides advantages in that it provides relaxed tolerances for the manufacture of sense amplifiers 100 having weighted transistors.

Figure 2:
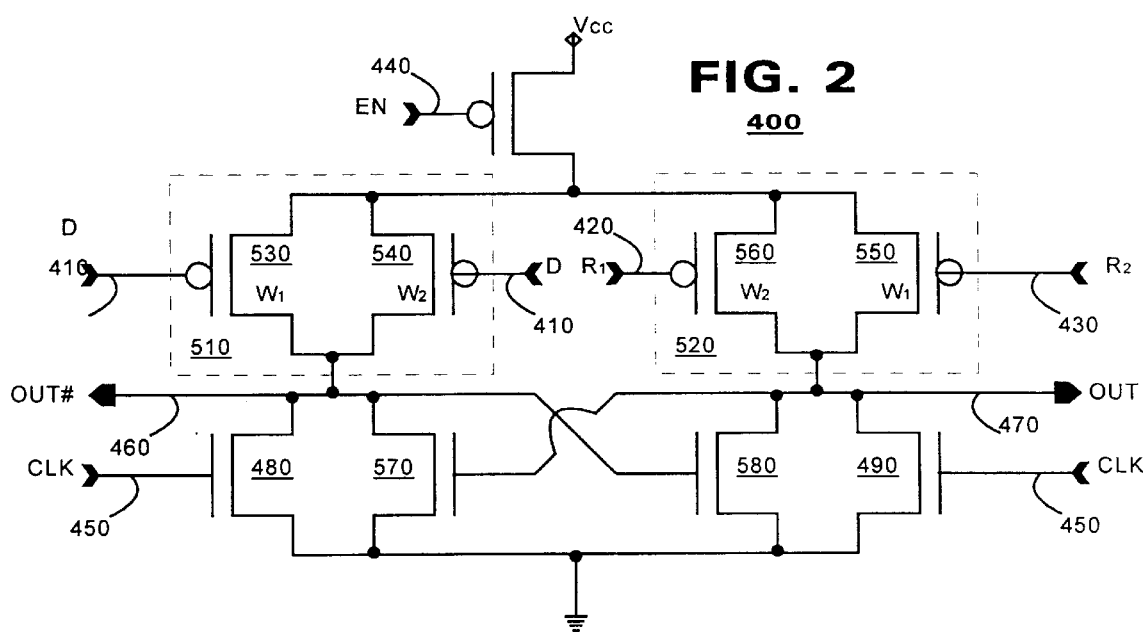
FIG. 2 illustrates a sense amplifier according to an embodiment of the present invention.

FIG. 2 illustrates a sense amplifier 400 constructed in accordance with another embodiment of the present invention. The sense amplifier 400 is populated with input terminals 410–430 for input of respective data signal D and reference signals $R_1$ and $R_2$. The sense amplifier 400 also may include input terminals 440, 450 for clock and enable signals. Further, the sense amplifier 400 may include output terminals 460, 470 for output signals OUT# and OUT.

This sense amplifier 400 of FIG. 2 illustrates an embodiment that may be applied in a "precharge low, enable high" system. That is, the precharge potential in this second embodiment may be ground (0 volts) and the evaluation potential may be $V_{CC}$. Again, the sense amplifier 400 may be used in an LVS system; evaluating signals may transition toward $V_{CC}$ but typically will not complete a full transition before the sense amplifier 400 outputs valid data.

The sense amplifier 400 may include precharge transistors 480, 490 coupling the respective output terminals 460, 470 to ground. The precharge transistors 480, 490 each may include gates that are coupled to the input terminal 450 associated with the clock signal.

The sense amplifier 400 may include an enabling transistor 500 coupled to the evaluation potential. A gate of the enabling transistor 500 may be coupled to the input terminal 440 associated with the enable signal.

The sense amplifier 400 may include an evaluation circuit 510 and a reference circuit 520. The evaluation circuit 510 may couple the OUT# output terminal 460 to the enable transistor 500. The evaluation circuit may include a pair of data transistors 530, 540 providing parallel charging paths from the enabling transistor 500 to the OUT# output terminal 460. Gates of the evaluation circuit may be coupled to the input terminal 410 associated with the D data signal.

The reference circuit 520 may couple the enable transistor 500 to the OUT output terminal 470. The reference circuit 520 may include a pair of transistors 550, 560 providing parallel charging paths from the enabling transistor 500 to the OUT output terminal 470. A gate of a first reference transistor 550 is coupled to an input terminal associated with the $R_1$ reference signal. A gate of a second reference transistor 560 is coupled to an input terminal associated with the $R_2$ reference signal.

The sense amplifier 400 also may include a pair of clamping transistors 570, 580. The first clamping transistor 570 couples the OUT# output terminal 460 to the precharge potential, ground. A gate of the first clamping transistor 570 is coupled to the OUT output terminal 470. The second clamping transistor 580 couples the OUT output terminal 470 to the precharge potential, ground. A gate of the second clamping transistor 580 is coupled to the OUT# output terminal 460.

The data transistors 530–540 and the reference transistors 550–560 may be selected to be of a type that is conductive in response to the precharge potential. In the "precharge low" embodiment of FIG. 2, the transistors 530–560 may be PMOS transistors. The precharge transistors 480–490 and the clamping transistors 570–580 may be selected to be of a type that is conductive in response to the evaluation potential. In the "evaluate high" embodiment of FIG. 2, the transistors 48–490, 570–580 may be NMOS transistors.

Consider operation of the sense amplifier 400 in the "precharge low, enable high" embodiment. During the precharge phase, the enable signal is high, rendering the enable transistor 500 non-conductive. The clock signal is at the precharge potential, rendering the clocking transistors 480, 490 conductive. The output terminals 460, 470 are precharged low. Because the output terminals 460, 470 are precharged low, the clamping transistors 570, 580 are non-conductive. Further, the data signal D and the two reference signals $R_1$, $R_2$ are precharged low, rendering transistors 530–560 conductive. Thus, the drain of the enabling transistor 500 is precharged low.

During the evaluation phase, the enable transistor 500 becomes conductive. The sources of the data transistors 530–540 and the reference transistors 550–560 are charge under the influence of the evaluation potential. In the reference circuit 520, the $R_2$ signal begins to transition toward the evaluation potential, rendering the second reference transistor 560 increasingly less conductive. However, because the $R_1$ signal remains at the precharge potential, the first reference transistor 550 remains strongly conductive. The OUT output terminal 470 begins to charge under the influence of the evaluation potential, $V_{CC}$.

In the evaluation circuit 510, the data signal D may or may not evaluate depending upon its information content. If the data signal D does not evaluate, it remains at the precharge potential and both data transistors 530, 540 remain strongly conductive. In this event, the OUT# output terminal 460 begins to charge under the influence of the evaluation potential via both data transistors 530, 540. If the data signal D does evaluate, both data transistors 530, 540 become increasingly less conductive and the OUT# output terminal 160 charges only partially under the influence of the evaluation potential.

As in the embodiment of FIG. 1, during the evaluation phase, the two data transistors 530, 540 of the sense amplifier 400 operate in unison; they either remain conductive or become less conductive as dictated by the value of the data signal D. By contrast, the reference transistors 550, 560 of the reference circuit 520 never operate in unison; one transistor 550 always remains conductive and the other transistor 560 always becomes less conductive during the evaluation phase. According to an embodiment of the present invention, this difference in operation achieves timing differences in the signals generated on the output terminals 460, 470. If the data signal evaluates, the OUT output terminal 470 charges faster than the OUT# output terminal 460; if not, the OUT output terminal 470 charges more slowly than the OUT# output terminal 460.

At the beginning of the evaluation phase, the two clamping transistors 570, 580 are non-conductive. As an output terminal (say, OUT# terminal 460) charges, however, the clamping transistor 580 associated with the other output terminal 470 becomes increasingly more conductive, permitting any charge developed at the other output terminal 470 to discharge. Thus, as a first output terminal 460 evaluates, it tends to prevent the other output terminal 470 from evaluating.

Eventually, during the evaluation phase, the charging effect of one of the output terminals 460 or 470 becomes dominant. One of the output terminals 460 evaluates and the other terminal 470 is prevented from evaluating.

According to an embodiment of the invention, the data transistors 530–540 and the reference transistors 550–560 of the sense amplifier 400 may be weighted devices. A first transistor 530, 550 in the evaluation circuit 510 and the reference circuit 520 may have a first weight (labeled $W_1$) and a second transistor 540, 560 of the respective circuits 510, 520 may have a second weight (labeled $W_2$). As has been discussed above, the relative difference in weights affects the rates at which output terminals 460, 470 may charge. According to an embodiment, weight $W_2$ is selected to provide a relatively slower charging path than $W_1$. In such an embodiment, if the data signal D were to evaluate, the OUT# output terminal 460 would charge primarily through transistor 540 (a $W_1$ transistor) while the OUT output terminal 470 would charge through transistor 560 (a slower, $W_2$ transistor). The OUT# output terminal 460 quickly becomes dominant in this event and, via the clamping transistor 580, returns the OUT output terminal 470 to the precharge potential. Alternatively, if the data signal D does not evaluate, the OUT# output terminal 160 would not discharge at all and the OUT terminal 470 would charge through transistor 560. The OUT terminal 470 becomes dominant and clamps the OUT# terminal 460 to the precharge potential via the clamping transistor 570.

As noted above, embodiments of the sense amplifier 400 may provide an evaluation circuit 510 and a reference circuit 520 that are mutually symmetrical. Design symmetry in this embodiment also alleviates difficulties in manufacture of integrated circuits based on weighted transistors because it becomes necessary to control relative differences in weights rather than absolute magnitudes of weights.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A sense amplifier, comprising:
   a pair of output terminals,
   an evaluation circuit connecting a first one of said output terminals to an evaluation potential source and having an input terminal for a data signal, wherein the evaluation circuit comprises a pair of data transistors, each coupling said first one of said output terminals to the evaluation potential source across a source to drain path and having a gate coupled to the data input terminal,
   a reference circuit connecting the other one of said output terminals to the evaluation potential source and having input terminals for a pair of reference signals, and
   a pair of clamping circuits, each coupling a respective one of the output terminals to a precharge potential source and having an input coupled to the other of the output terminals.

2. The sense amplifier of claim 1, wherein the evaluation circuit and the reference circuit are mutually symmetrical.

3. The sense amplifier of claim 1, wherein the reference circuit comprises a pair of transistors, each coupling an output terminal to the evaluation potential source across a source to drain path,
   wherein the first transistor has a gate coupled to the input terminal of the first reference signal, and
   wherein the second transistor has a gate coupled to the input terminal of the second reference signal.

4. The sense amplifier of claim 1, wherein:
   the reference circuit comprises a pair of reference transistors, each coupling an output terminal to the evaluation potential source across a source to drain path, the first reference transistor having a gate coupled to the input terminal of the first reference signal and the second reference transistor having a gate coupled to the input terminal of the second reference signal,
   wherein the first data transistor and the first reference transistor have substantially similar weights.

5. The sense amplifier of claim 1, wherein each clamping circuit comprises a transistor connecting a respective output terminal to the precharge potential source across a source to drain path and having a gate connected to the other output terminal.

6. The sense amplifier of claim 1, further comprising:
   another input terminal for a clock-signal, and
   a pair of precharge transistors, each coupling a respective one of the output terminals to the precharge potential source and having a gate coupled to the clock input terminal.

7. The sense amplifier of claim 1, further comprising an enabling transistor coupling the data and reference circuits to the evaluation potential source.

8. A sense amplifier, comprising:
   a pair of output terminals,
   an evaluation circuit connecting a first one of said output terminals to an evaluation potential source, having at least a fast evaluation path, wherein the evaluation circuit comprises a pair of data transistors, each coupling said first one of said output terminals to the evaluation potential source across a source to drain path and having a gate coupled to a data signal source,
   a reference circuit connecting the other one of said output terminals to the evaluation potential source and having at least an evaluation path, and
   a pair of clamping circuits, each coupling a respective one of the output terminals to a precharge potential source and having an input coupled to the other of the output terminals.

9. The sense amplifier of claim 8, wherein the evaluation circuit and the reference circuit are mutually symmetrical.

10. The sense amplifier of claim 8, wherein the reference circuit comprises a pair of transistors, each coupling an output terminal to the evaluation potential source across a source to drain path,
    wherein the first transistor has a gate coupled to a first reference signal source, and
    wherein the second transistor has a gate coupled to a second reference signal source.

11. The sense amplifier of claim 8, wherein:
    the reference circuit comprises a pair of reference transistors, each coupling an output terminal to the evaluation potential source across a source to drain path, the first reference transistor having a gate coupled to a first reference signal source and the second reference transistor having a gate coupled to a first reference signal source,
    wherein the first data transistor and the first reference transistor have substantially similar weights.

12. The sense amplifier of claim 8, wherein each clamping circuit comprises a transistor connecting a respective output terminal to the precharge potential source across a source to drain path and having a gate connected to the other output terminal.

13. The sense amplifier of claim 8, further comprising:
    an input terminal for a clock signal, and
    a pair of precharge transistors, each coupling a respective one of the output terminals to the precharge potential source and having a gate coupled to the clock input terminal.

14. The sense amplifier of claim 8, further comprising an enabling transistor coupling the data and reference circuits to the evaluation potential source.

15. A sense amplifier, comprising:
    a pair of output terminals,
    a pair of clamping circuits, each coupling a respective output terminal to an evaluation potential source, an evaluation circuit connecting a first one of said clamping circuits to an evaluation potential source and having an input terminal for a data signal, wherein the evaluation circuit comprises a pair of data transistors, each coupling the first one of said clamping circuits to the evaluation potential source across a source to drain path and having a gate coupled to the data input terminal, and a reference circuit connecting the other one of said clamping circuits to the evaluation potential source and having input terminals for a pair of reference signals.

16. The sense amplifier of claim 15, wherein the evaluation circuit and the reference circuit are mutually symmetrical.

17. The sense amplifier of claim 15, wherein the reference circuit comprises a pair of transistors, each coupling the second clamping circuit to the evaluation potential source across a source to drain path, wherein the first transistor has a gate coupled to the input terminal of the first reference signal, and wherein the second transistor has a gate coupled to the input terminal of the second reference signal.

18. The sense amplifier of claim 15, wherein:

the reference circuit comprises a pair of reference transistors, each the second clamping circuit to the evaluation potential source across a source to drain path, the first reference transistor having a gate coupled to the input terminal of the first reference signal and the second reference transistor having a gate coupled to the input terminal of the second reference signal, wherein the first data transistor and the first reference transistor have substantially similar weights.

19. The sense amplifier of claim 15, wherein each clamping circuit comprises a precharge transistor connecting a respective output terminal to the precharge potential source across a source to drain path and having a gate connected to the other output terminal.

20. The sense amplifier of claim 19, wherein a first clamping circuit further comprises an evaluation transistor coupling the first output terminal to the evaluation circuit and having a gate coupled to the second output terminal.

21. The sense amplifier of claim 20, wherein a second clamping circuit further comprises a second evaluation transistor coupling the second output terminal to the reference circuit and having a gate coupled to the first output terminal.

22. The sense amplifier of claim 15, further comprising:

another input terminal for a clock signal, and a pair of precharge transistors, each coupling a respective one of the output terminals to the precharge potential source and having a gate coupled to the clock input terminal.

23. A sense amplifier, comprising:

a pair of output terminals, a pair of clamping circuits, each coupling a respective output terminal to a source of an evaluation potential and having an input coupled to the other of the output terminals an evaluation circuit connecting a first clamping circuit to the evaluation potential source, having at least a fast evaluation path, wherein the evaluation circuit comprises a pair of data transistors, each coupling the first clamping circuit to the evaluation potential source across a source to drain path and having a gate coupled to the input terminal, a reference circuit connecting a second clamping circuit to the evaluation potential source and having at least an evaluation path.

24. A method for generating an output signal based on a low voltage swing data signal, comprising:

precharging a pair of output terminals; and during an evaluation phase of a data signal:

according to information content of the data signal, transitioning a first output terminal toward an evaluation potential at a rate using an evaluation circuit comprising a pair of data transistors, each coupling an output terminal to the evaluation potential across a source to drain path and having a gate coupled to a data signal source, transitioning the second output terminal toward the evaluation potential at a predetermined slower rate, responsive to a potential difference between the output terminals, clamping an output terminal to the precharge potential.

25. The method of claim 24, further comprising, response to the potential difference, clamping the other output terminal to the evaluation potential.

26. The method of claim 24, wherein if the data signal evaluates, the second output terminal is clamped to the precharge potential.

27. The method of claim 24, wherein if the data signal does not evaluate, the first output terminal is clamped to the precharge potential.

* * * * *

UNITED STATES PATENT AND TRADEMARK OFFICE
CERTIFICATE OF CORRECTION

PATENT NO.    : 6,255,861 B1
DATED         : July 3, 2001
INVENTOR(S)   : Kevin X. Zhang It is certified that error appears in the above-identified patent and that said Letters Patent is hereby corrected as shown below:

Column 10,
Line 39, "comprising, response to" should be -- comprising, in response to --

Signed and Sealed this

Twenty-fifth Day of March, 2003

JAMES E. ROGAN
*Director of the United States Patent and Trademark Office*